United States Patent
Koitsalu et al.

(10) Patent No.: US 6,316,721 B1
(45) Date of Patent: Nov. 13, 2001

(54) METHOD AND A DEVICE FOR SHIELDING ELECTRONIC COMPONENTS

(75) Inventors: Evald Koitsalu, Huddinge; Lars Wallin, Bromma; Michael Persson, Löddeköpinge, all of (SE)

(73) Assignee: Telefonaktiebolaget LM Ericsson, Stockholm (SE)

(*) Notice: Subject to any disclaimer, the term of this patent is extended or adjusted under 35 U.S.C. 154(b) by 0 days.

(21) Appl. No.: 09/467,014

(22) Filed: Dec. 20, 1999

(30) Foreign Application Priority Data

Dec. 21, 1998 (SE) .................................. 9804452

(51) Int. Cl.7 .................................................. H05K 9/00
(52) U.S. Cl. ......................................... 174/35 R; 361/818
(58) Field of Search ............................. 174/35 R, 356 C; 361/818, 748, 753, 800

(56) References Cited

U.S. PATENT DOCUMENTS

| | | |
|---|---|---|
| 3,809,233 | 5/1974 | Gruszka . |
| 5,175,395 | 12/1992 | Moore . |
| 5,335,147 * | 8/1994 | Weber ................................. 174/35 R |
| 5,880,938 * | 3/1999 | Johnsen et al. ..................... 174/35 R |
| 6,049,468 * | 4/2000 | Learmonth ......................... 174/35 R |

FOREIGN PATENT DOCUMENTS

| | | |
|---|---|---|
| 296 12 557 U1 | 10/1996 | (DE) . |
| 462944 B | 8/1990 | (SE) . |
| 95/28075 A1 | 10/1995 | (WO) . |

* cited by examiner

*Primary Examiner*—Shawn Riley
(74) *Attorney, Agent, or Firm*—Nixon & Vanderhye P.C.

(57) ABSTRACT

A shielding device is formed by a wall having a top edge arranged to fasten a foil comprising an electrically conducting material. In order to fasten the foil, the wall can be provided with teeth at its top section. Also the wall(s) can be formed with arbitrary angles with respect to each other when forming a whole shielding device. The cover can be formed by one large or several smaller pieces. The cover is fastened to the walls by means of an adhesive, glue or soldering and an electrical contact is provided by the teeth projecting from the wall(s).

15 Claims, 2 Drawing Sheets

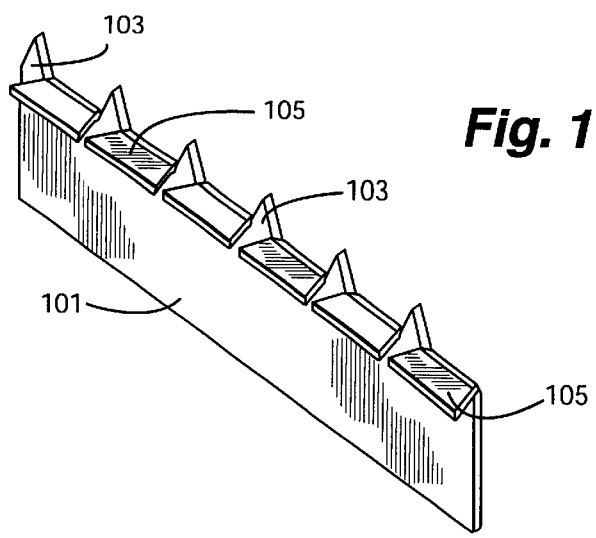
Fig. 1
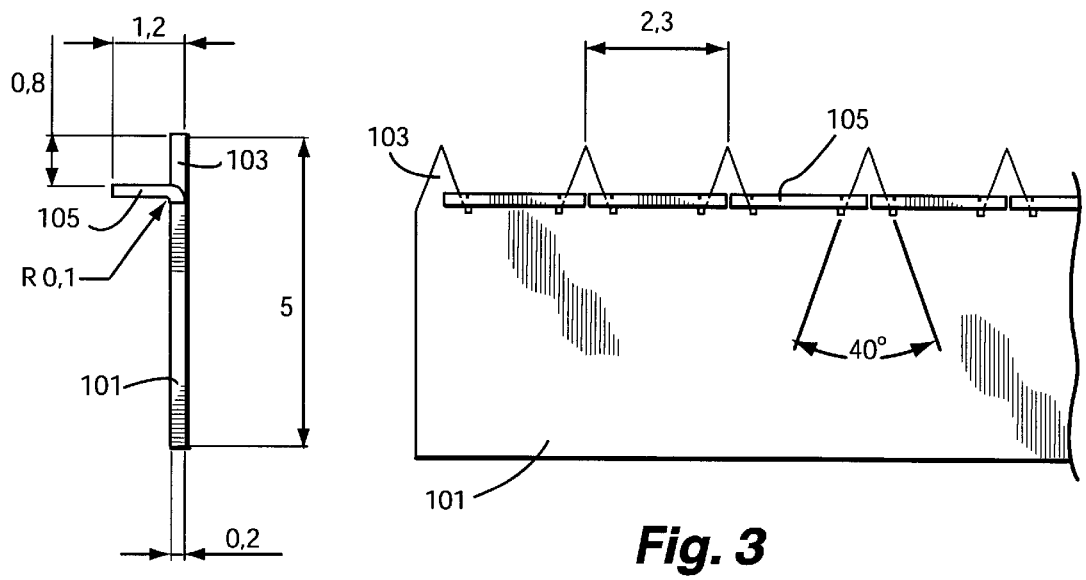
Fig. 2
Fig. 3
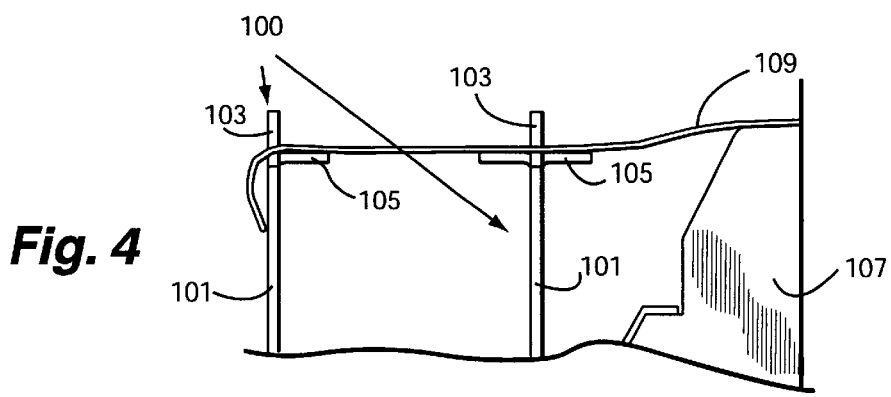
Fig. 4

METHOD AND A DEVICE FOR SHIELDING ELECTRONIC COMPONENTS

TECHNICAL FIELD

The present invention relates to a method and a device for shielding electronic components and in particular for shielding components mounted on a printed circuit board.

BACKGROUND OF THE INVENTION AND PRIOR ART

In many applications it is required to shield electronic components from the surrounding environment. Thus, in the fields of e.g. radio transmitters, radio receivers, computers and other electronic devices, it is highly desirable to provide an electromagnetic shield around components emitting and/or sensitive to absorbing electromagnetic radiation.

In order to provide the electromagnetic shield it is common to arrange a rectangular shaped device of a metallic material over the electronic components.

Such a device is disclosed in U.S. Pat. No. 5,175,395, which describes an electromagnetic shielding device formed by walls of an electrical conductive material. On top of the walls a cover of an electrically conducting material is provided.

However, electronic components have become smaller and smaller thereby allowing the circuit boards on which they are mounted to be smaller as well. Conventional shielding devices typically have a top of approximately a few tenth of a millimeter. In today's technique this represents quite a large part of the height available on the circuit board for many applications.

Also, there is often a requirement that the top should be possible to lift off in order to perform service or replacement of different circuits mounted on the printed circuit board. Conventional shielding devices having a top which can be lift off are expensive.

Thus, there is a need for a small shielding device, which adds as little as possible to the height of the printed circuit board, and having a top which can be removed for service purposes and the like.

SUMMARY

It is an object of the present invention to overcome the problem as outlined above and to provide a shielding device having small dimensions.

This object is obtained by a shielding device formed by a wall having a top edge arranged to fasten a foil comprising an electrically conducting material. In order to fasten the foil, the wall can be provided with teeth at its top section. Also the wall(s) can be formed with arbitrary angles with respect to each other when forming a whole shielding device.

The cover can be formed by one large or several smaller pieces. The cover is preferably fastened to the walls by means of an adhesive and an electrical contact is provided by the teeth projecting from the wall(s).

Thus, by forming the top of the shield by a foil the height of the electromagnetic shield can be reduced significantly. Further, since a foil is a flexible material it will follow the shape of the components on the printed circuit board. Thus, if a component would project higher up from the printed circuit board, there will be no problem, as would be the case if the top was made of an inflexible material or a material having a low flexibility.

Furthermore, the walls can be made more flexible, since the fastening means between the top and the wall does not require a particular shape of the top.

BRIEF DESCRIPTION OF THE DRAWINGS

The present invention will now be described in more detail by way of non-limiting examples and with reference to the accompanying drawings, in which:

FIG. 1 is a view in perspective of a wall in a shielding device.

FIG. 2 is a sectional view of a wall.

FIG. 3 is a side view of a wall.

FIG. 4 is a sectional view from the side of a shielding device.

DESCRIPTION OF PREFERRED EMBODIMENTS

Figure 5:
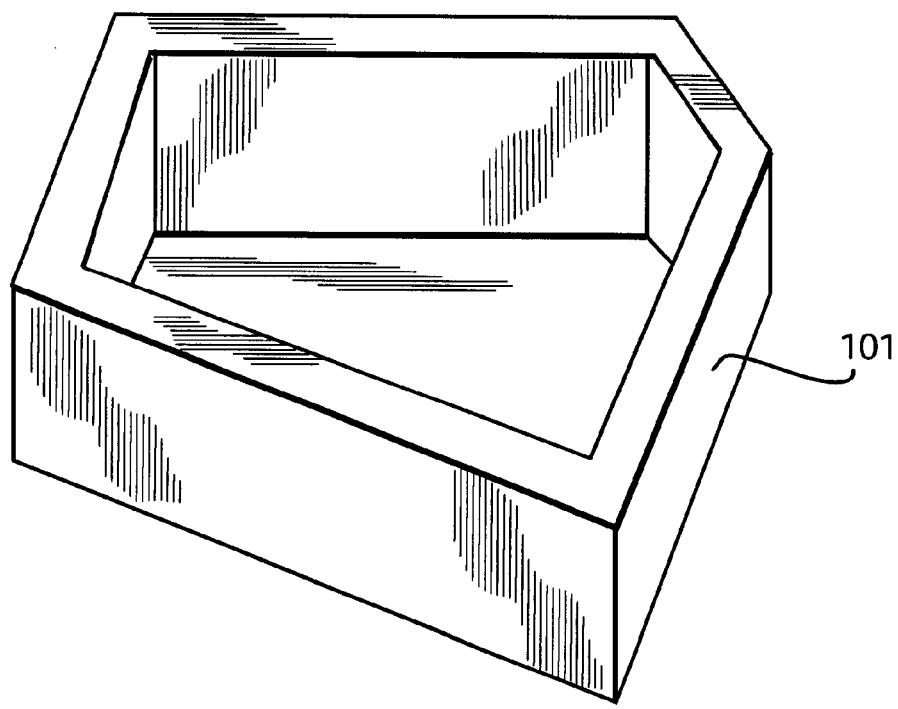
FIG. 5 is a schematic view in perspective of a shielding device.

In FIG. 1, a portion of wall of a shielding device for shielding electronic components mounted on a printed circuit board is shown. The wall comprises a base portion 101, teeth 103 projecting in a direction essentially parallel with the plane of the base portion, and foil attachment plates projecting in a direction essentially perpendicular from the base portion. The base portion 101, the teeth 103 and the plates 105 are in a preferred embodiment made from the same work piece.

The wall is made of a material having good shielding characteristics, such as a metal or a plastics material covered with a layer of a metal. The base portion 101 is arranged to be attached to a printed circuit board, for example by means of soldering or gluing.

In FIG. 2, having the same reference numerals as FIG. 1, a section of the wall is shown. In the example the wall has a height of 500 $\mu$m, including the teeth which projects 80 $\mu$m. The wall is about 20 $\mu$m thick and the plates 103 project about 100 $\mu$m from the wall. The object of the teeth 103 is to penetrate a foil which is fastened to the wall in order to provide an electrical contact between the foil and the wall.

The thickness and the height of the wall can be varied within a large range in order to suit a particular application. The object of the plate 105 is to provide a surface onto which the foil can be fastened, for example by means of gluing.

In FIG. 3, having the same reference numerals as FIG. 1, a part of the wall is shown from the side. Thus, the teeth 103, which are cut out of the wall, are separated by a distance of about 23 $\mu$m and have a top angle of about 40°. This angle can however be varied within a broad range, e.g. 1°–70° and in particular 30°–50°.

In FIG. 4, having the same reference numerals as FIG. 1, a sectional view of a integrated circuit 107 shielded by a shielding device is shown. Thus, walls 100 are located at suitable locations on the printed circuit board on which the integrated circuit(s) are mounted.

In order to provide a complete shielding of the integrated circuit 107, a foil 109 is attached to the top of the walls 100. The foil has a thickness being preferably smaller than the height of the teeth 103, so that the teeth penetrate the foil when it is fastened to the walls, and thereby ensures that the wall and the foil become electrically connected to each other. The foil is preferably fastened to the walls by means of a glue or an adhesive.

In FIG. 5, a schematic view of a shielding device as described herein is shown. For clarity reasons only the wall 101 is shown. Thus, since the wall 101 is made of a flexible material, the wall 101 can be given an arbitrary shape, such as polygonal, as shown in FIG. 5 or circular or any other suitable shape. The wall can be made of one single piece of material or made of several smaller pieces attached to each other, whichever turns out to be the most advantageous for a particular application.

The foil is made of a material having good shielding characteristics, and can for example be made of metal. Furthermore, the foil can comprise an isolating material at suitable locations or over the whole side facing the integrated circuit in order to provide isolation towards the integrated circuit. Also, several smaller pieces of foil can be used instead of one large piece. The different pieces can then be of different types or of different materials. For example, one piece may have one side covered with an isolating layer, whereas other pieces in the same shielding device may be a pure metal foil.

Since the part forming the top portion of the shielding device is a foil, the wall(s) can be formed with arbitrary angles with respect to each other when forming a whole shielding device. Furthermore, the top or cover can be formed by one large or several smaller pieces, whichever turns out to be the most advantageous for a particular application.

Thus, by forming the top of the shield by a foil the height of the electromagnetic shield can be reduced significantly. Further, since a foil is a flexible material it will follow the shape of the components on the printed circuit board. Thus, if a component would project higher up from the printed circuit board, there will be no problem, as would be the case if the top was made of an inflexible material or a material having a low flexibility. Furthermore, the walls can be made more flexible, since the fastening means between the top and the wall does not require a particular shape of the top.

What is claimed is:

1. A shielding device for shielding electronic components mounted on a printed circuit board, having a wall comprising an electrically conducting material and a cover comprising an electrically conducting material, characterized in that the cover is a foil arranged to be fastened to the wall.

2. A device according to claim 1, characterized in that the wall is provided with teeth at its top section, the teeth penetrating the foil thereby providing an electrical connection between the wall and the foil.

3. A device according to any of claims 1, characterized in that the wall is provided with plates projecting in a direction essentially perpendicular to the plane of the wall.

4. A device according to claim 3, characterized in that the wall and the plates are made from the same work piece.

5. A device according to claim 1, characterized in that the wall is made of a metal or a plastics material covered with a metal layer.

6. A device according to claim 1, characterized in that the wall has a height of less than 500 $\mu$m.

7. A device according to claim 2, characterized in that the teeth have a top angle of about 30°–50°.

8. A device according to claim 1, characterized in that the foil is fastened to the wall by means of a glue or an adhesive.

9. A device according to claim 2, characterized in that the foil has a thickness being equal to or less than the height of the teeth.

10. A device according to claim 1, characterized in that the foil is made of a metal.

11. A device according to claim 1, characterized in that the foil is provided with an insulating layer on the side of the foil facing the components on the printed circuit board.

12. A device according to claim 1, characterized in that the wall is made from one single work piece having arbitrary angles.

13. A method of manufacturing a shielding device for shielding electronic components mounted on a printed circuit board, having a wall comprising an electrically conducting material, comprising fastening a foil cover to the top portion of the wall.

14. A method according to claim 13, characterized in that before the foil is fastened to the wall, teeth are cut out of the top portion of the wall, and wherein the foil cover is pressed down onto the teeth so that the teeth penetrate the foil cover thereby providing an electrical connection between the wall and the foil cover.

15. A device according to claim 2, wherein the teeth projects less than 80 $\mu$m from the wall.

* * * * *